(12) United States Patent
Gebhardt

(10) Patent No.: US 9,229,072 B2
(45) Date of Patent: Jan. 5, 2016

(54) METHOD AND HIGH-FREQUENCY CHECK DEVICE FOR CHECKING A HIGH-FREQUENCY TRANSMIT DEVICE OF A MAGNETIC RESONANCE TOMOGRAPHY SYSTEM

(75) Inventor: Matthias Gebhardt, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 931 days.

(21) Appl. No.: 13/417,015

(22) Filed: Mar. 9, 2012

(65) Prior Publication Data

US 2012/0238861 A1 Sep. 20, 2012

(30) Foreign Application Priority Data

Mar. 11, 2011 (DE) .......................... 10 2011 005 433

(51) Int. Cl.
*A61B 5/055* (2006.01)
*G01R 33/26* (2006.01)

(52) U.S. Cl.
CPC ...................................... *G01R 33/26* (2013.01)

(58) Field of Classification Search
CPC ............. G01R 33/5612; G01R 33/288; G01R 33/34046; G01R 33/3415; G01R 33/26
USPC ............................ 324/300–322; 600/407–422
See application file for complete search history.

(56) References Cited

U.S. PATENT DOCUMENTS

| | | | |
|---|---|---|---|
| 6,812,698 B1 | 11/2004 | Tsukamoto | |
| 2006/0047198 A1 | 3/2006 | Sugimoto | |
| 2006/0197528 A1 | 9/2006 | Bielmeier et al. | |
| 2007/0024283 A1* | 2/2007 | Bielmeier et al. | ............ 324/314 |

(Continued)

FOREIGN PATENT DOCUMENTS

| | | |
|---|---|---|
| CN | 1742675 A | 3/2006 |
| CN | 1823684 A | 8/2006 |

(Continued)

OTHER PUBLICATIONS

German Office Action dated Oct. 24, 2011 for corresponding German Patent Application No. DE 10 2011 005 433.2 with English translation.

(Continued)

*Primary Examiner* — Melissa Koval
*Assistant Examiner* — Rishi Patel
(74) *Attorney, Agent, or Firm* — Lempia Summerfield Katz LLC

(57) ABSTRACT

A method for checking a high-frequency transmit device of a magnetic resonance tomography system, excitation vectors that represent high-frequency signal strengths on the individual transmit channels are determined for a plurality of time points or time periods. High-frequency exposure values absorbed in an examination object are determined in accordance with predetermined check rules on the basis of the excitation vectors. The high-frequency transmit device is restricted in function when an exposure check value that is based on at least one high-frequency exposure value reaches or exceeds a predetermined limit check value. The check rules are predetermined as a function of a current transmit mode of the high-frequency transmit device. The respective transmit mode of the high-frequency transmit device is verified on the basis of the excitation vectors. When a transmit mode change is detected, the check rules are changed, and/or the high-frequency transmit device is restricted in function.

17 Claims, 2 Drawing Sheets

(56) References Cited

U.S. PATENT DOCUMENTS

| | | | |
|---|---|---|---|
| 2008/0157765 A1* | 7/2008 | Fontius et al. | 324/309 |
| 2008/0197848 A1 | 8/2008 | Zhai et al. | |
| 2009/0108842 A1* | 4/2009 | Habara et al. | 324/307 |
| 2010/0167668 A1* | 7/2010 | Nistler et al. | 455/101 |
| 2010/0253338 A1 | 10/2010 | Eryaman et al. | |
| 2010/0308825 A1* | 12/2010 | Brinker et al. | 324/309 |
| 2010/0327868 A1* | 12/2010 | Gebhardt et al. | 324/307 |
| 2011/0224924 A1* | 9/2011 | Eichfelder et al. | 702/57 |

FOREIGN PATENT DOCUMENTS

| | | |
|---|---|---|
| CN | 101933807 A | 5/2011 |
| DE | 10 2009 024 077 A1 | 12/2010 |
| DE | 10 2009 030 721 A1 | 12/2010 |
| DE | 10 2010 011 588 A1 | 9/2011 |
| EP | 1629773 A | 3/2006 |
| JP | 2001070282 A | 3/2001 |
| JP | 2008543413 A | 12/2008 |
| JP | 2009072571 A | 4/2009 |
| WO | WO2010113131 A1 | 10/2010 |

OTHER PUBLICATIONS

Lawrence L. Wald, et al., "Specific Absorption Rate (SAR) in Parallel Transmission (pTx)," MAGNETOM Flash, 2010, pp. 65-73.

J. Lee, et al., "Parallel Transmit RF Design with Local SAR Constraints," 18$^{th}$ Annual Meeting of ISMRM, 2010, Stockholm, Sweden.

Chinese Office Action for related Chinese Application No. 2012100569155, mailed Jun. 16, 2015, with English Translation.

English Translation of Japanese Office action for related Japan Application No. 2012-053441, dated Oct. 5, 2015.

* cited by examiner

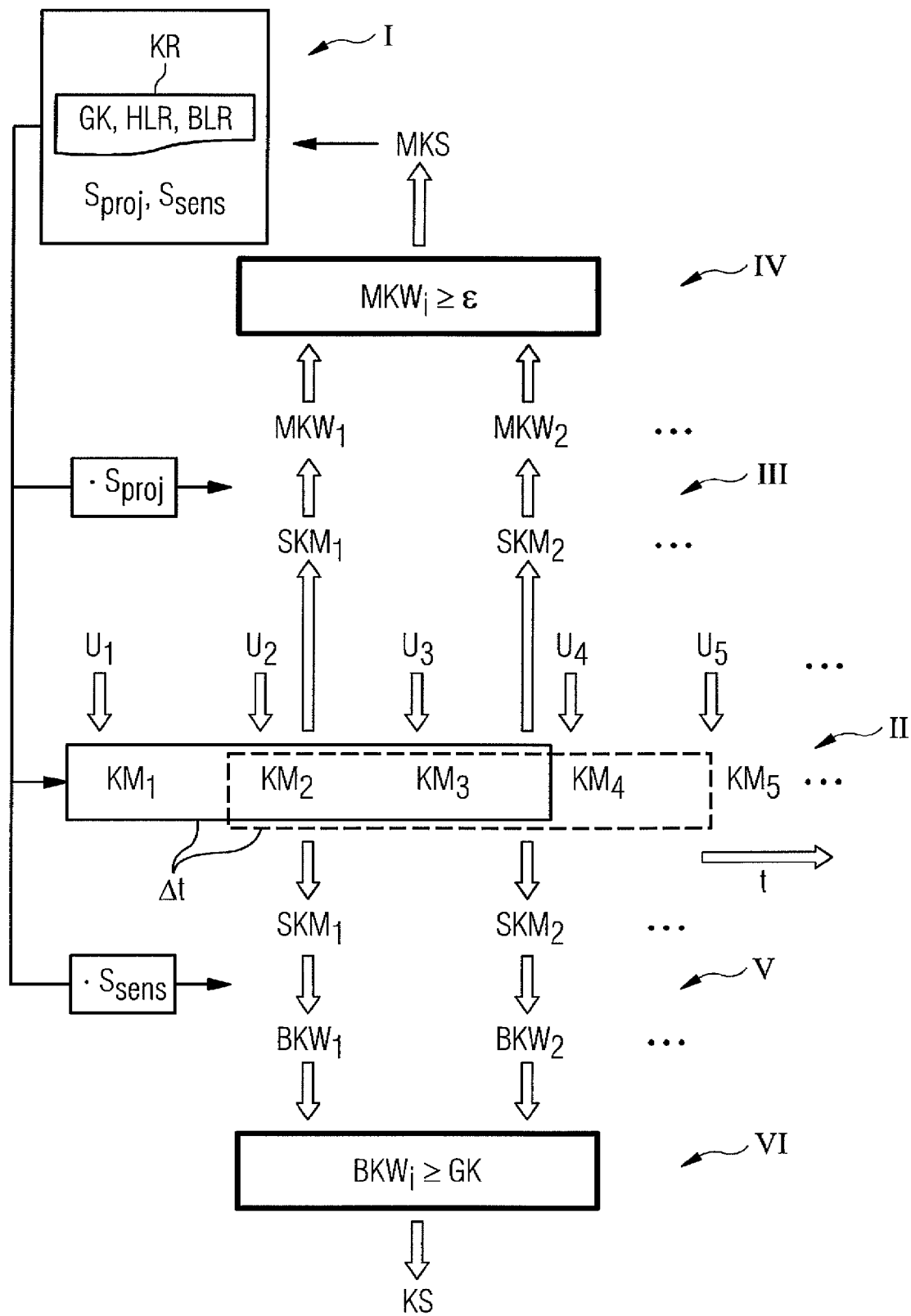

METHOD AND HIGH-FREQUENCY CHECK DEVICE FOR CHECKING A HIGH-FREQUENCY TRANSMIT DEVICE OF A MAGNETIC RESONANCE TOMOGRAPHY SYSTEM

This application claims the benefit of DE 10 2011 005 433.2, filed on Mar. 11, 2011.

BACKGROUND

The present embodiments relate to a method for checking a high-frequency transmit device of a magnetic resonance tomography system.

In a magnetic resonance system, a body to be examined may be exposed to a relatively high basic field magnetic field of, for example, 3 or 7 tesla with the aid of a basic field magnet system. A magnetic field gradient is also applied with the aid of the gradient system. High-frequency excitation signals (HF signals) are emitted by a high-frequency transmit system using suitable antenna devices. The high-frequency excitation signals are used to tip the nuclear spin of certain atoms that have been excited in a resonant manner by this high-frequency field, with spatial resolution through a defined flip angle relative to the magnetic field lines of the basic magnetic field. During relaxation of the nuclear spin, high-frequency signals (e.g., magnetic resonance signals) are emitted. The high-frequency signals are received using suitable receive antennas and are further processed. Raw data thus acquired may be used to reconstruct desired image data. The emission of the high-frequency signals for nuclear spin magnetization may take place using a "whole-body coil" or "body coil," or also (in the case of many measurements) using local coils that are placed on the patient or participant. A typical structure of a whole-body coil is a birdcage antenna including a plurality of transmit rods that are disposed in parallel with the longitudinal axis around a patient chamber of the tomography system, in which a patient is present during the examination. End faces of the antenna rods are respectively connected in a capacitive manner in a ring.

The whole-body antennas may be operated as "volume coils," in, for example, a "CP mode," in which a circularly polarized high-frequency signal (HF signal) is transmitted as homogeneously as possible into the whole of the volume that is enclosed by the whole-body antenna. For this purpose, a single temporal HF signal is emitted to all components of the transmit antenna (e.g., all transmit rods of a birdcage antenna). In this case, the pulses may be transferred to the individual components in a phase-shifted manner with a displacement that is adapted to the geometry of the transmit coil. For example, in the case of a birdcage antenna with 16 rods, the rods may each be shifted through 22.5° phase displacement with the same HF magnitude signal.

Such a homogeneous excitation results in a global high-frequency exposure (HF exposure) of the patient. The global high-frequency exposure is to be limited according to the usual rules, as too high a high-frequency exposure may harm the patient. HF exposure may include not only the HF energy that has been introduced, but also a physiological exposure that has been induced by the HF irradiation. A typical measure of the high-frequency exposure is the specific absorption rate (SAR) value that indicates, in watts/kg, the biological exposure acting on the patient due to a certain high-frequency pulse output, or the specific energy dose (SED). Either value may be converted into the other. According to the IEC standard, a standard limit of 4 watts/kg at a "first level" currently applies with respect to the global whole-body SAR or HF exposure of a patient, for example. Accordingly, the total power that is absorbed by a patient must not exceed a value of 4 watts/kg in a time window that is averaged over six minutes. In order to provide this, the high-frequency exposure is monitored continuously during each measurement by suitable safety devices on the magnetic resonance system. A measurement is changed or terminated if the SAR value exceeds the specified standards.

In the context of more recent magnetic resonance systems, individual HF signals tailored for imaging purposes may be assigned to the individual transmit channels (e.g., the individual rods of a birdcage antenna). A multichannel pulse train including a plurality of individual high-frequency pulse trains that may be emitted in parallel via the different independent high-frequency transmit channels is emitted for this purpose. Such a multichannel pulse train (e.g., a "pTX pulse" due to the parallel emission of the individual pulses) may be used as an excitation, refocusing and/or inversion pulse, for example. Such a transmit antenna system, which allows the parallel emission of pTX pulses via a plurality of independent transmit channels, is also referred to as a "transmit array," which term is used in the following (irrespective of the appearance in detail of the architecture of the transmit antenna system).

During the emission of multichannel pulse trains, the previously homogeneous excitation may be replaced by an excitation of any form in the measurement chamber and hence also in the patient. In order to estimate the maximal high-frequency exposure, every possible high-frequency superimposition is therefore to be considered.

The monitoring of the superimposed electrical fields over a plurality of individually activatable antenna elements is important, for example, because the electrical fields add up in a vectorially linear manner. The local power release and hence the exposure of the patient at the relevant location is proportional to the square of the resulting electrical field.

The local high-frequency exposure may not be measured directly. Suitable body models having a (complex) conductivity distribution are therefore created, and the suitable body models are used to calculate the fields that are produced by the respective antenna elements at the individual locations of the model. Such calculations are performed in the prior art using a finite different time domain (FDTD) method, for example. In this case, the examination object may be divided into a plurality of voxels, and the electrical field strengths that are produced by the individual antenna elements, and the superimposition thereof, are determined for each voxel. Given the plurality of voxels concerned (e.g., many models have 50,000 voxels, others have many more than 100,000 and even several million voxels in extreme cases) and due to the complexity of the calculations to be performed, realtime monitoring or online capability may not be provided when such an approach is used.

DE 10 2009 030 721 describes a method and a device for SAR monitoring, in which cross-correlation matrices of excitation vectors relating to the individual antenna elements are determined for a plurality of time points or time periods in each case. The cross-correlation matrices are added up over a summation time period. The sum matrix is multiplied by a number of hotspot sensitivity matrices. Each hotspot sensitivity matrix represents the sensitivities at a plurality of points of the examination object with reference to the calculation of the maximal local high-frequency exposure (e.g., SAR). Such "hotspots" may develop in the high-frequency field in the patient. The applied HF power and hence the physiological high-frequency exposure at the hotspots may produce a multiple of the values previously experienced from the homogeneous excitation. In order to provide that the local high-frequency exposure does not exceed the limit values, it is therefore only necessary to monitor these hotspots. DE 10 2010 011 160 also describes a method that facilitates correct selection of the hotspots with reference to previously performed electromagnetic simulations (e.g., FDTD).

The flexibility in the excitation of spin magnetizations using transmit arrays allows emission of a homogeneous high-frequency signal in the whole volume, as per the previous volume coils. A transmit array may also be operated in a "volume coil mode," which may be appropriate for many measurements and/or examinations. Such a "volume coil mode" or "homogeneous mode" in the following may be an operating mode of the high-frequency transmit device, in which the transmit array is operated in a manner equivalent to that of a volume coil (e.g., the transmit channels are operated using high-frequency signals that have a fixed amplitude and phase relationship).

Accordingly, the present regulations and/or standards relating to the high-frequency exposure also stipulate that transmit arrays feature properties of both volume coils and local coils, and that the monitoring rules to be applied in each case (e.g., the limit values) depend on the way in which the transmit array is used. In this context, monitoring of the local SAR is required when used in the manner of local coils (e.g., with low limit values that are relatively narrowly defined), while only a whole-body SAR or exposed-part-of-body SAR is monitored when used as a volume coil.

In order to operate a transmit array as a volume coil, a "Butler matrix" may be used between the high-frequency amplifiers of the high-frequency transmit system and the antenna elements. All of the transmitters may be switched off except for the transmit channel that is used by the Butler matrix for the volume mode. The Butler matrix is equivalent to an electrical hardware-type connection of the transmit arrays as a volume coil. However, such a hardware connection has the disadvantage that the already available high-frequency amplifiers of the individual transmit channels are unevenly utilized. While one amplifier of a channel is to deliver the full high-frequency power, the amplifiers of the other channels remain unused. A further consequence is that at least the high-frequency amplifier used for the volume coil mode, and all subsequent components in the transmit channel, are configured for a significantly higher high-frequency voltage. This makes the system relatively expensive.

The transmit array may be operated in a volume coil mode by using software alone to activate the high-frequency amplifiers of the individual transmit channels such that the individual elements of the transmit arrays are operated using relative amplitude and phase relationships that have been preset correspondingly. The operating mode of the transmit array therefore only differs from an operating mode, in which individual non-homogeneous fields are emitted, in that corresponding commands are output to the high-frequency amplifier (e.g., the pTX pulse is selected accordingly). Seen from the transmit side, the transmit array is therefore classified as a use in the form of local coils, and therefore the local SAR limit values (as required for local transmit coils) that are far too low would actually apply (e.g., even though it would be sufficient only to apply the whole-body SAR limit values due to the operation in the volume coil mode). The local SAR limit values, which are far too low for the volume coil mode, would therefore not allow the operation of the customary single-channel volume coil application.

SUMMARY AND DESCRIPTION

The present embodiments may obviate one or more of the drawbacks or limitations in the related art. For example, a method and an appropriate high-frequency check device that allows both secure monitoring of the high-frequency exposure of the examination object and simple operation of a transmit array in a volume coil mode is provided.

The method of the present embodiments provides for determining excitation vectors for a plurality of time points or time periods, where the excitation vectors represent the high-frequency signal strengths on the individual transmit channels at the respective time point or time period. For example, these excitation vectors may have the voltage amplitudes that are currently measured on the various transmit channels at a specific time point. However, the excitation vectors may also be measured values that are dependent on these voltages and are determined, for example, by directional couplers or other sensors (e.g., pickup coils). The measured values of the individual channels at the respective measurement time point are treated as elements of the current excitation vector. In addition, high-frequency exposure values that exist in the examination object globally or locally (e.g., at the hotspots) are determined respectively on the basis of the excitation vectors and in accordance with predetermined check rules. The high-frequency transmit device is restricted in function (e.g., the present power is reduced, or the high-frequency transmit device is switched off completely (the measurement is terminated)) if an exposure check value that is based on at least one high-frequency exposure value reaches or exceeds a predetermined limit check value. For example, this exposure check value may be the present high-frequency exposure value, in each case, if the high-frequency exposure values are already global SAR values, for example. However, an exposure check value may be determined on the basis of a plurality of high-frequency exposure values. For example, all of the high-frequency exposure values determined in a specific time window may be integrated, or an average value may be derived therefrom in order to determine the exposure check value. One example of this is the averaging of the global whole-body SAR limit of 4 watts/kg within a six-minute time window. Likewise, conversion into a physical exposure (e.g., into SAR values) may be applicable if the high-frequency exposure values are initially calculated such that the high-frequency exposure values (only) represent the irradiated HF power. In this case, the physiological effect of the HF power on the tissue may be taken into account when determining the exposure check value on the basis of the high-frequency exposure values.

In this context, the check rules are predetermined as a function of a current transmit mode of the high-frequency transmit device, and the respective transmit mode of the high-frequency transmit device is verified on the basis of the excitation vectors and independently of the other usual activation of the transmit channels. If a transmit mode change is detected, the check rules are changed as appropriate, and/or the high-frequency transmit device is restricted in unction.

As a result of continuously checking the transmit mode of the high-frequency transmit device with reference to the currently measured excitation vectors, it is possible to also provide that the correct check rules (e.g., the correct limit values) are used for the high-frequency exposure check at all times in the transmit mode concerned. As a consequence, both the safety of the patient is provided at every time point, and flexible use of the transmit arrays is possible in all operating modes without a measurement being unnecessarily interrupted due to the incorrect choice of limit values or other check rules, which would ultimately result in greater overall exposure of the patient if the measurement had to be repeated.

One embodiment of a high-frequency check device, for a high-frequency transmit device of a magnetic resonance tomography including such a transmit antenna system with a plurality of transmit channels, has a measured value interface for capturing excitation vectors for a plurality of time points or time periods. The excitation vectors represent the high-frequency signal strengths on the individual transmit channels. Such a measured value interface may be, for example, a measurement input for connection of an independent measuring device. According to the present embodiments, the measuring device may include various sensors or similar for measuring the high-frequency signal strength on the individual transmit channels (e.g., an arrangement of directional couplers, pickup coils or similar, that are disposed at and/or in the individual transmit channels).

The high-frequency check device includes a check signal interface for outputting check signals. For example, a suitable check signal may be generated by the check signal interface, if necessary. The suitable check signal may be transferred to other components of the high-frequency transmit device (e.g., the high-frequency amplifier) in order to terminate a measurement or reduce the transmit power. Check signals may also be used to retrieve the current check rules (e.g., the current limit values for the current measurement) from a memory or similar device.

According to the present embodiments, the high-frequency check device is also configured such that high-frequency exposure values that have been absorbed in the examination object are calculated according to predetermined check rules on the basis of the excitation vectors in each case. The high-frequency transmit device is restricted in function (e.g., by the check signals) when an exposure check value that is based on at least one high-frequency exposure value reaches or exceeds a predetermined limit check value. The check rules are predetermined as a function of a current transmit mode of the high-frequency transmit device. The high-frequency check device may include corresponding modules for this purpose (e.g., an exposure check unit) in order to calculate the exposure check values from the high-frequency exposure values in accordance with the predetermined rules.

According to the present embodiments, the high-frequency check device is further configured such that the transmit mode of the high-frequency device is verified in each case on the basis of the excitation vectors. If a transmit mode change is detected, the check rules are changed, and/or at least a check signal is generated in order to restrict the high-frequency transmit device in function. The high-frequency check device may include, for example, a suitable mode check unit for this purpose.

Significant parts of the high-frequency check device may be designed in the form of software components. This relates, for example, to the exposure check unit and the mode check unit. The measured value interface may also be realized as software-based interface, for example, that accepts data that has already been recorded and combined into a vector by another unit. The check signal interface may be an interface that is realized in the form of software, for example, and that sends the check signals using software alone to another control component (e.g., realized in the form of software) of the high-frequency transmit device. However, the interfaces may also be designed only partially in the form of software, possibly also relying on hardware interfaces of a computer that is present.

The present embodiments therefore also include a computer program that may be loaded directly into a memory of a high-frequency check device and includes program code for executing all of the acts of the method of the present embodiments when the program is executed in the high-frequency check device. Such a software-based realization has the advantage that previously existing high-frequency check devices realized using suitable programmable processors and memories may also be modified as appropriate by implementing the program, in order thus to work in the manner in the present embodiments.

The high-frequency check device may also be integrated into the high-frequency transmit device in the form of individual components. However, the high-frequency check device may also be designed as an independent device that includes the measured value interface for capturing excitation vectors, the check signal interface, and the further components cited above. Existing magnetic resonance tomography systems may be upgraded to include such an independent high-frequency check device.

In addition to a transmit antenna system including a plurality of transmit channels that may be activated independently and a high-frequency power amplifier arrangement for emitting high-frequency pulses via the transmit channels, a high-frequency transmit device according to the present embodiments, for a magnetic resonance tomography system, includes at least one high-frequency check device that is constructed in the manner described above.

A magnetic resonance tomography system according to the present embodiments includes such a high-frequency transmit device.

The claims in one class (e.g., the method) may also be developed in a similar way to another class (e.g., a high-frequency transmit device).

One purpose of the present embodiments is to verify whether a high-frequency transmit device is still transmitting in the assumed transmit mode, since the check rules for checking the high-frequency exposure of the patient are selected as a function of the current transmit mode. These check rules include the rules for determining the high-frequency exposure values (e.g., the way, in which high-frequency exposure values are calculated from the excitation vectors), but also, the rules for determining the exposure check values (e.g., how check values are calculated from the high-frequency exposure values (e.g., the time period, over which high-frequency exposure values are averaged, if applicable, and which conversions are applied to the values, if applicable)) in order to obtain an exposure check value. The check rules further include the definition of the limit check values (e.g., which SAR limit values are to be used for the current measurement). These limit values depend on the way, in which the high-frequency exposure values and/or the exposure check values were calculated (e.g., by which rules). Accordingly, all of these rules may also be predetermined or changed as a function of the transmit mode of the high-frequency transmit device. Depending on the precise situation, it may be sufficient to change only some of the rules (e.g., only the limit check values) and to retain the rules for determining the high-frequency exposure values and/or the exposure check values.

A check of the transmit mode on the basis of the excitation vectors may be performed in various ways. In one embodiment, a mode check value that characterizes the respective transmit mode is determined on the basis of the excitation vectors, and a transmit mode change is detected (e.g., the check rules are changed, and/or the high-frequency transmit device is restricted in function) if the mode check value deviates from a mode reference value by a specified degree. Provision may be made for defining how the mode check value is to appear if the high-frequency transmit system is working in the current desired transmit mode. This value is the mode reference value. The mode check value is determined and compared with the mode reference value. The mode reference value may also be 0 in principle (e.g., if the mode check value represents a deviation of the actual mode from a desired mode).

The degree to which the current mode check value is allowed to deviate from the mode reference value, without being judged as a transmit mode change, may again be defined in various ways. For example, an absolute degree of deviation may be selected.

Alternatively, the degree of deviation may also be selected so as to be proportional (e.g., to the strength of the excitation vectors). A combination of these evaluation rules may also be applied. An absolute value for the degree of deviation may be specified in the case of low signal strengths, and a relative deviation may be used as an evaluation criterion in the case of high signal strengths whether or not the desired transmit mode is still being used.

Any desired transmit mode may be verified in the manner of the present embodiments, provided the desired transmit mode has been defined once, and a relevant mode reference value has been calculated, for example. In one embodiment, at least one suitable SAR limit value may be selected. A global SAR limit value that is to be used for operation in a volume coil mode is lower than a local SAR limit value that is prescribed if the transmit array generates individual non-homogeneous excitation patterns. During verification of the transmit mode, whether the high-frequency transmit device and/or the transmit antenna system is operating in a volume mode may be verified. A verification may establish whether the high-frequency transmit device is operated in a CP mode, as may be the case when using birdcage whole-body coils. The method of the present embodiments and the high-frequency check device may also be used for checking other transmit modes such as, for example, other volume coil modes (e.g., constant elliptically polarized modes (EP mode), as is used in many systems depending on the application). Since the CP mode is the most frequently used volume coil mode, it is assumed in the following (unless specified otherwise) that a CP mode is to be monitored, without thereby restricting the scope of the invention.

In one embodiment, for the purpose of determining a deviation of the operation of the high-frequency transmit device from the volume coil mode, simple quadratic forms of the respective current excitation vectors (e.g., forming cross correlations of the elements of the excitation vectors) are generated by two-way multiplication with a special projection matrix, where the projection matrix was generated on the basis of standard excitation vectors occurring during operation in the relevant volume coil mode. This projection matrix is designed such that the projection matrix projects the complete signal contained in the excitation vector (where the elements of the vector represent the current signal strengths on the individual transmit channels) onto an undesired component that is orthogonal to the desired signal (e.g., onto precisely the portion, by which the current excitation vector deviates from the ideal excitation vector, that the system should have during operation in the volume coil mode). The mode check value is therefore easy to calculate on the basis of the deviation value resulting from this two-way multiplication. The mode reference value may be set to 0, for example. A more detailed description of the method and the generation of the projection matrix is described below with reference to an exemplary embodiment for the CP mode.

In one embodiment, a mode check value may be generated on the basis of a plurality of consecutive current mode check partial values that have been determined during a mode check time slot. In this context, the mode check partial values may be generated in each case by two-way multiplication of the projection matrix with the excitation vectors, for example. The mode check partial values within the mode check time slot are added up or integrated, or an average value is generated.

Another embodiment provides an effective realization in technical terms of the approach that is described mathematically above. A current cross-correlation matrix is calculated for a plurality of time points within a mode check time slot using a dyadic multiplication (e.g., generation of a tensor product) of the respective current excitation vector with a complex-conjugate vector, and the cross-correlation matrices are added up to form a sum cross-correlation matrix. The sum cross-correlation matrix may be multiplied with the projection matrix, and the resulting product values may be used to generate the mode check value for the respective mode check time slot. The product values may be added up, integrated or used to generate an average value, for example.

One advantage of this method is that the measured data (e.g., the excitation vectors) that is determined at short time intervals (e.g., every 10 μs) is added up or integrated, and a multiplication is performed once for the whole mode check time slot instead of performing a plurality of corresponding multiplications each time a current excitation vector is captured. This makes the whole calculation method considerably more efficient.

A further feature of this method is that an exposure check value may also be based on a sum cross-correlation matrix determined for a mode check slot and containing the current excitation vectors in the mode check slot. For example, this sum cross-correlation matrix may be multiplied with a sensitivity matrix, as in the method described in DE 10 2009 030 721, in order to obtain an exposure check value. In this case, the cross-correlation matrices may, respectively, be considered as high-frequency exposure values (which initially take only the irradiated HF power into account). During the calculation of the exposure check value, the conversion into a physiological (SAR) exposure may also be effected at the same time by the multiplication with the sensitivity matrix.

It is advantageous for an exposure check value to be based on a plurality of high-frequency exposure values that are calculated in an exposure check time slot. If it is provided that the exposure check time slot is identical to a mode check time slot, this condition is automatically satisfied by the previously described method for calculating an exposure check value on the basis of the sum cross-correlation matrix that has been calculated for a mode check time slot.

The mode check time slots and/or the exposure check time slots may be predetermined in each case by a time window that slides over the excitation vectors in the time segment. A mode check value or exposure check value that slides in the time segment is therefore generated.

It is advantageous for various check values to be taken into consideration over time windows of different lengths (e.g., a short-time check value over a window that is 10 s long, and a long-time check value over a window that is 360 s long). A peak exposure of the patient is avoided by considering the different lengths, and that overall radiation exposure is not excessive, but remains just below the peak limit values at all times.

BRIEF DESCRIPTION OF THE DRAWINGS

FIG. 2 shows a flow diagram of one embodiment of a method for checking a high-frequency transmit device.

DETAILED DESCRIPTION OF THE DRAWINGS

Figure 1:
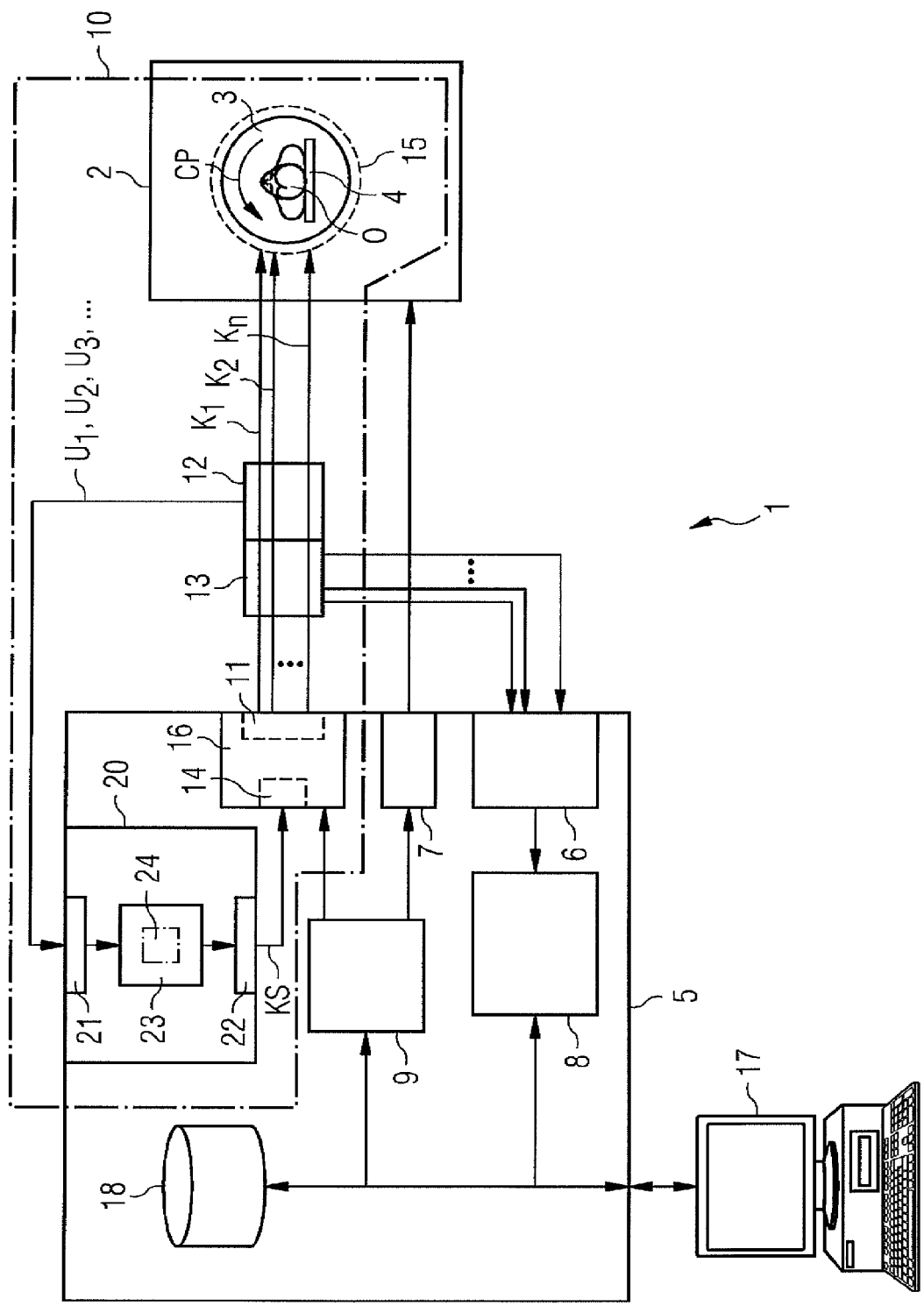
FIG. 1 shows a schematic overview of a magnetic resonance system including one embodiment of a high-frequency transmit device.

The computer tomography system 1 shown in a schematic manner in FIG. 1 includes a scanner or tomograph 2, using which actual measurements are performed. The tomograph 2 contains a measurement chamber 3 (e.g., a patient tunnel), in which a patient or examination object O may be positioned on a patient couch 4. As a transmit antenna system 15, the tomograph 2, for example, features a whole-body coil 15 including a plurality n of separately activatable transmit channels $K_1$, $K_2, \ldots, K_n$ or antenna elements, such that any desired field distributions may be produced in the measurement chamber 3. For example, the whole-body coil 15 may be a birdcage coil featuring n independently activatable conductor rods as antenna elements. The antenna elements are arranged parallel to each other on a cylinder surface around the measurement chamber 3 and are coupled together. The present embodiments, however, are not restricted to such transmit antenna systems 15, and any desired transmit array may be used. For example, the transmit antenna system may not form a whole-body coil. Instead, the transmit antenna system may be a plurality of suitably disposed local coils, or the transmit antenna system may be a head coil or similar, having various transmit channels.

The tomograph 2 additionally contains a magnet system including a basic field magnet for establishing a strong basic magnetic field in the measurement chamber 3, and a plurality of gradient coils each for establishing the desired magnetic field gradients in the three spatial directions. For greater clarity, however, these components are not illustrated in FIG. 1.

The tomograph 2 is activated by a system control unit 5. The system control unit 5 is connected to a terminal 17, by which the whole magnetic resonance tomography system 1 may be operated. The coupling of the tomograph 2 to the system control unit 5 is effected via a plurality of interfaces.

One interface of the plurality of interfaces, for example, includes a high-frequency power amplifier arrangement 11 of the high-frequency transmit device 10, a further interface being a receive interface 6. The relevant high-frequency pulse sequences for a measurement are emitted via the high-frequency power amplifier arrangement 11, and the received magnetic resonance raw data is accepted via the receive interface 6. In another embodiment (not shown), the power amplifier arrangement 11 is integrated in the tomograph 2, and the corresponding interface is provided by control lines, acknowledgement lines and power supply.

An interface block 7 represents further interfaces that are provided for activating further components of the tomograph 2 (e.g., the interfaces for activating the gradient coils, the advance of the patient couch, etc.).

A measurement control module 9 that may be activated by the operator via the terminal 19, and a data memory 18 are illustrated as further components in the system control unit 5. The measurement control module 9 may be used to specify the parameters on the basis of measurement protocols, which are stored, for example, in the data memory 18 and may be modified by the operator, such that suitable signals are sent to the tomograph 2 via the interfaces in order to perform a measurement using a very specific pulse sequence (e.g., a high-frequency pulse sequence and a suitable gradient pulse sequence).

The system control unit 5 also includes a reconstruction device 8 that reconstructs the magnetic resonance images from the raw data that is received from the receive interface 6. The magnetic resonance images may be stored in the memory 18 and/or output on the display of the terminal 17.

The magnetic resonance tomography system 1 (e.g., the system control unit 5) may include a number of further components (e.g., interfaces for connection to a network for the purpose of transferring the generated images to other stations, etc.). Since the fundamental structure of magnetic resonance systems is known, however, all of these components have been omitted from FIG. 1, and a detailed explanation thereof has likewise been omitted for the sake of clarity.

In order that the individual antenna elements (e.g., conductor rods of the whole-body coil 15) may be activated separately, the high-frequency transmit device 10 is comprehensively fitted with n separate transmit channels $K_1, K_2, \ldots, K_n$. The actual high-frequency pulse generating system 16 includes n individual transmit modules (not shown), in which, for example, the high-frequency signals may be generated in the form of small signals for the individual channels. For the purpose of amplifying these signals, the high-frequency transmit device also has a high-frequency power amplifier arrangement 11 including n separate high-frequency amplifiers. The high-frequency amplifiers are represented as a block in FIG. 1 for the sake of simplicity. The high-frequency signals are sent from the high-frequency amplifiers to the individual antenna elements of the whole-body coil 15 via lines. The high-frequency signals pass through both an n-channel transmit/receive changeover switch arrangement 13 and an n-channel directional coupler arrangement 12. The transmit/receive changeover switch arrangement 13 is designed such that in a transmit mode state, the lines to the individual antenna elements are connected to the high-frequency power amplifier arrangement 11. In a receive mode state (e.g., for the detection of magnetic resonance signals using the whole-body coil 15), a changeover occurs such that the antenna elements of the whole-body coil 15 are connected to the appropriate receive channels of the receive interface 6.

The directional coupler arrangement 12 is designed such that the directional coupler arrangement 12 extracts, from the signals that are emitted by the high-frequency amplifiers of the high-frequency power amplifier arrangement 11, a signal portion that is proportional to the current signal strength (e.g., the voltage amplitude) on the respective transmit channel $K_1$, $K_2 \ldots K_n$, with a specific phase, and is therefore complex-valued. These values, measured at a specific time point may, for example, already be combined in the directional coupler arrangement 12 to form an excitation vector $U_1, U_2, U_3, \ldots$ (the index represents the measurement time point) that is sent to a measured value interface 21 of a high-frequency check device 20 of the high-frequency transmit device 10. Instead of the excitation voltage, the currents may also be determined as measured values for the excitation vector.

The high-frequency check device includes an exposure check unit 23 that calculates check values on the basis of the current excitation vectors $U_1, U_2, U_3, \ldots$ and therefore monitors the high-frequency exposure in the examination object O. The high-frequency check device also includes a mode check unit 24 that uses the current excitation vectors $U_1, U_2, U_3, \ldots$ to check whether the high-frequency transmit device 10 is being operated in the currently intended transmit mode, for which the check rules currently in use by the exposure check unit 23 to monitor the high-frequency exposure are being used. The mode check unit 24 may be part of the exposure check unit 23, or vice versa. Alternatively, the mode check unit 24 and the exposure check unit 23 may be separate intercommunicating units.

If the exposure check unit 23 establishes that the predetermined exposure limit values are not being adhered to, a check signal KS is output via a check signal interface 22 and accepted at a check signal input 14 by the HF pulse generating system 16 of the high-frequency transmit device 10. The check signal KS triggers a complete interruption of the measurement or a reduction in the signal strength of the high-frequency signals that are emitted. For example, a signal may be output directly from the check signal input 14 to the high-frequency power amplifier arrangement 11, in order to reduce the output power at the high-frequency power amplifier arrangement or turn the system off completely. In another embodiment (not shown), the exposure check unit 23, the mode check unit 24 and the other associated components 21, 22 are integrated directly into the tomograph 2. This may be advantageous, for example, if the amplifier arrangement 11 is already integrated in the tomograph 2.

If the mode check unit 24 establishes that the intended transmit mode is not being adhered to, a check signal KS is likewise output via the check signal interface 22 to a check signal input of the HF pulse generating system and/or the exposure check unit 23 is notified of this. The exposure check unit 23 performs the subsequent exposure checking on the basis of other more suitable check rules (e.g., limit values).

The precise mode of working within the high-frequency check device 20 is explained below with reference to FIG. 2.

As explained above, for the purpose of determining a deviation of the operation of the high-frequency transmit device from a volume coil mode, the quadratic form of the respective current excitation vectors is produced by two-way multiplication with a special projection matrix. This may be mathematically expressed as follows:

$$U^H S_{proj} U \quad (1)$$

In this case, U is the current complex-valued excitation vector, the upper index H signifying that the vector is complex-conjugated and transposed. $S_{proj}$ is the special projection matrix, which corresponds to a "projector and detector" for the undesired portion of the excitation vector U. The undesired portion does not match a volume coil mode.

Such a projection matrix $S_{proj}$ for the detection of the undesired portion may be obtained as described below. It is again assumed that the desired excitation vector is developed such that the high-frequency transmit device is operated in a conventional CP mode. The following therefore assumes a complex-valued n-channel excitation vector $U_{CP}$ that is normalized at 1 (e.g., $\|U_{CP}\|=1$) and describes the ideal excitation vector for a CP mode. In the case of a birdcage coil or cylinder coil having n identically formed antenna rods that are distributed around the circumference, this vector may be described as follows:

$$U_{CP} = \frac{1}{\sqrt{\eta}} \left( e^{\frac{i \cdot 0 \cdot 2\pi}{n}}, e^{\frac{i \cdot 1 \cdot 2\pi}{n}}, e^{\frac{i \cdot 2 \cdot 2\pi}{n}}, \ldots, e^{\frac{i \cdot (n-1) \cdot 2\pi}{n}} \right)^T \quad (2)$$

In this context, η is a normalization factor in order to provide the desired normalization at 1, and the upper index T at the end of the vector signifies that the vector is transposed. Using such an excitation vector $U_{CP}$, the excitation would rotate annularly around the antenna structure as in the case of a conventional resonator in the CP mode. Therefore, the $B_1$ field (e.g., the magnetic high-frequency field that is desired for the measurement) would rotate as desired in the measurement region ($B_1^+$, see also FIG. 1). The physical direction of rotation is to be correct in this case.

The method may also be used for all other transmit modes and is not restricted to such a CP mode. For example, the further considerations do not utilize the given example for a CP excitation, and apply generally to excitation vectors having any desired amplitude and phase relationships. The phase relationships are nonetheless predetermined and fixed. The term CP mode and the designation $U_{CP}$ are therefore merely exemplary in the following considerations.

In a synthetic CP mode (the term "synthetic" is chosen here because the CP mode is predetermined by appropriate selection of the fixed phase and amplitude relationships in a transmit array that is actually flexible, and not by a fixed connection as in the case of a conventional volume coil mode), the desired time-dependent excitation may therefore be represented as follows:

$$U_{CP}(t) = A(t) \cdot U_{CP} \quad (3)$$

In order to obtain the current excitation vector in the CP mode, a time-dependent (e.g., complex-valued) prefactor A(t) is multiplied with the temporally constant normalized excitation vector U.

Any chosen excitation vector U may be broken down into a portion that is proportional to $U_{CP}$ up to a complex-valued factor α, and a linearly independent and hence orthogonal portion $U_{rest}$. A simple method for determining the relevant factor α consists in projecting the chosen excitation vector U using the scalar product with $U_{CP}$. Therefore, assuming a current excitation vector of $$U = \alpha U_{CP} + U_{rest} \quad (4)$$

the scalar product $$U_{CP}^H \cdot U = U_{CP}^H \cdot (\alpha U_{CP} + U_{rest}) = U_{CP}^H \cdot \alpha U_{CP}^H \cdot U_{rest} = \alpha + 0 = \alpha \quad (5)$$

produces the relevant factor α. The normalization $\|U_{CP}\| = U_{CP}^H \cdot U_{CP} = 1$ and the orthogonality $U_{CP}^H \cdot U_{rest} = 0$ are applied in this context.

On the basis of the equations (4) and (5), the deviation $U_{rest}$ of the excitation vector from the desired CP excitation is as follows:

$$U_{rest} = U - \alpha U_{CP} = U - (U_{CP}^H \cdot U) \cdot U_{CP} \quad (6)$$

The associated power-type variable for this deviation, the variable being relevant for the thermal effects (e.g., for the power remaining in the patient and causing the high-frequency exposure), is therefore:

$$\begin{aligned}
\|U_{rest}\|^2 &= (U - (U_{CP}^H \cdot U) \cdot U_{cp})^H \cdot (U - (U_{CP}^H \cdot U) \cdot U_{CP}) = \\
&= U^H \cdot U - (U_{CP}^H \cdot U)^H \cdot U_{CP}^H \cdot U - U^H \cdot U_{CP} \cdot \\
&\quad (U_{CP}^H \cdot U) + (U_{CP}^H \cdot U)^H \cdot U_{CP}^H \cdot U_{CP} \cdot (U_{CP}^H \cdot U) = \\
&= U^H \cdot U - (U^H \cdot U_{CP}) \cdot (U_{CP}^H \cdot U) - (U^H \cdot U_{CP}) \cdot \\
&\quad (U_{CP}^H \cdot U) + (U^H \cdot U_{CP}) \cdot (U_{CP}^H \cdot U_{CP}) \cdot (U_{CP}^H \cdot U) = \\
&= U^H (I - U_{CP} \otimes U_{CP}^H - \\
&\quad U_{CP} \otimes U_{CP}^H + U_{CP} \cdot I \otimes U_{CP}^H) \cdot U = \\
&= U^H (I - U_{CP} \otimes U_{CP}^H) \cdot U
\end{aligned} \quad (7)$$

In this context, I is the unit matrix (e.g., identity matrix), and the part $U_{CP} \otimes U_{CP}^H$ is the dyadic product or tensor product (e.g., an n×n matrix) having elements that are the element-type products of the components of the vector $U_{CP}$. The normalization $U_{CP}^H \cdot U_{CP} = 1$ is again applied in the equation (7).

The part in parentheses in the last equation term of the equation (7) is the relevant projection matrix $$S_{proj} = I - U_{CP} \otimes U_{CP}^H \tag{8}$$

This matrix is likewise an n×n projection matrix, which produces a measure for the square of the deviation of the current transmit mode from the CP mode in the quadratic form $U^H \cdot S_{proj} \cdot U$ for any desired excitation vectors U (or if any other mode is selected instead of the excitation vector $U_{CP}$ for the CP mode). The time integral of the desired excitation vectors U is a "power-type" positive scalar variable. For an ideal excitation in a CP mode, having a form as per equation (3), the condition $$MKW = \int U^H(t) \cdot S_{proj} \cdot U(t) dt = 0 \tag{10}$$

should be satisfied for the scalar time integral that may be used as a mode check value MKW.

In practice, it may be assumed that small deviations from the ideal CP mode exist, and therefore whether the mode check value MKW deviates from 0 by a specified degree is to be checked. In this context, threshold values ε that are not to be exceeded by the value MKW may be defined over suitable time intervals for the purpose of mode monitoring. Various criteria may be applied or combined for the definition of these threshold values.

For example, it is to be provided that the mode check value MKW, if greater than 0, is at least significantly lower than the actual pulse energy (e.g., the pulse predominantly results in a CP mode, and the deviation is to be relatively small in relation to the height of the CP-type pulse). It is also to be provided that any local SAR effects of the deviation, the effects being estimated using extremely conservative safety factors, are negligibly small in absolute terms relative to acceptable local SAR values for the CP mode.

The precise definition of the permissible deviation of the deviation integral or of the mode check value from the mode reference value (e.g., the reference value 0) should be performed in a suitable manner, possibly depending on the application concerned. However, this changes nothing with respect to the fundamental way in which the transmit mode is analyzed and checked.

As explained above, an excitation vector U is measured every 10 us or more frequently in practice. Moreover, the calculation of the deviation integral MKW, as shown in equation (10), uses a relatively large amount of computing effort, since two-way multiplication of the projection matrix $S_{proj}$ with the current excitation vector U takes place at every time point t, and the values are only then added up (e.g., integrated). In order to improve the efficiency of the technical analysis, an equivalent calculation may be performed by first calculating the cross-correlations of the elements of the individual excitation vectors U(t) and adding up or integrating these. The sum cross-correlation matrix $$SKM = \int U(t) \otimes \overline{U}(t) dt \tag{11}$$

which is thus determined and is likewise an n×n matrix, may be multiplied (in terms of elements) with the projection matrix $S_{proj}$, and the individual elements may be added up in order to arrive at the value MKW as per equation (10). This has the advantage that the measured data only has to be multiplied once over the whole integral time period (e.g., a second).

Apart from this, the sum cross-correlation matrix SKM may also be used for calculating the exposure check values, in order to calculate, for example, the global SAR within the integral time period.

One embodiment is described below with reference to FIG. 2. Check rules such as, for example, rules ALR for determining the high-frequency exposure values, rules BLR for determining the exposure check values, and limit check values GK are specified in a first method act I. In addition, a projection matrix $S_{proj}$ is calculated or selected from a number of previously calculated suitable projection matrices for the transmit mode that is to be monitored (e.g., a CP mode). Provision is further made for selecting sensitivity matrices $S_{sens}$, using which exposure check values $BKW_i$ may be calculated as explained below.

During the measuring time, high-frequency pulses (not shown) are emitted at time intervals in each case. Furthermore, at regular time intervals during the emission of the high-frequency pulses, the voltage amplitudes of the high-frequency signals on the individual transmit channels $K_1$, $K_2$, ..., $K_n$ are determined with the aid of the directional coupler arrangement 22. An excitation vector $U_1$, $U_2$, $U_3$, ... (e.g., a transmit amplitude vector in this case) for the various time points t is calculated therefrom in each case. On the basis of these excitation vectors $U_1$, $U_2$, $U_3$, ..., tensor multiplications $$KM = U(t) \otimes \overline{U}(t) \tag{12}$$

are then used to determine, in each case, the current cross-correlation matrices $KM_1$, $KM_2$, $KM_3$, ... (see act II in FIG. 2).

These cross-correlation matrices $KM_1$, $KM_2$, $KM_3$, ... represent the high-frequency power that is irradiated into the examination object and allow the local SAR to be monitored with the aid of the sensitivity matrices by taking the spatial superimposition of the individual transmit channels into account. These cross-correlation matrices $KM_1$, $KM_2$, $KM_3$, ... may therefore be considered as high-frequency exposure values. These are used to generate time-dependent sum cross-correlation matrices $SKM_1$, $SKM_2$, ... by adding up (or integrating) all of the cross-correlation matrices $KM_1$, $KM_2$, $KM_3$, ... that are present in a predetermined time window Δt in accordance with equation (11). The time window Δt slides with the time over the calculated transmit amplitude vectors $U_1$, $U_2$, $U_3$, ... and/or cross-correlation matrices $KM_1$, $KM_2$, $KM_3$, ..., in order to thus obtain a sliding value. In this case, it is not (as shown in FIG. 2) necessary for the time window to be shifted in each case by only one measured transmit amplitude vector $U_1$, $U_2$, $U_3$, .... Likewise, it is not essential for the time windows of two successive sum cross-correlation matrices $SKM_1$, $SKM_2$, ... to overlap.

The sum cross-correlation matrices $SKM_1$, $SKM_2$, ... may therefore be used in two ways. The sum cross-correlation matrices $SKM_1$, $SKM_2$, ... may be used as a basis for calculating scalar mode check values $MKW_1$, $MKW_2$, ... $MKW_i$, ... in accordance with equation (10), by multiplying the sum cross-correlation matrices $SKM_1$, $SKM_2$, ... (in terms of elements in each case) with the desired projection matrix $S_{proj}$ and adding up the values (cf. act III in FIG. 2). The mode check values $MKW_1$, $MKW_2$, ... $MKW_i$, ... thus calculated are compared with a mode reference value, or whether the mode check value $MKW_i$ deviates from 0 by more than a defined degree ε is established. If this is the case, a mode check signal MKS is emitted, which may result in, for example, different check rules being specified (e.g., the limit values GK may be tightened (see act IV in FIG. 2)).

The sum cross-correlation matrices $SKM_1$, $SKM_2$, ... for the individual time windows Δt may also be used to determine exposure check values $BKW_1$, $BKW_2$, ... $BKW_i$, .... For this purpose, the sum cross-correlation matrices $SKM_1$, $SKM_2$, ... may be multiplied, in each case, with the sensitivity matrices $S_{sens}$, which allow the monitoring of the local SAR (see act V in FIG. 2).

Details relating to this method are described, for example, in DE 10 2009 030 721.4 and in DE 10 2010 011 160, to which the present application in this respect refers explicitly with regard to the contents.

The exposure check values $BKW_1$, $BKW_2$, ..., $BKW_i$, ... thus calculated are compared, in each case, with a limit check value GK (see act VI in FIG. 2). If is it established that an exposure check value $BKW_i$ reaches or exceeds the limit check value GK, a check signal KS is output (e.g., as explained above with reference to FIG. 1) and provides that the output powers of the high-frequency power amplifiers are reduced.

In the context of the method of the present embodiments, as in previous monitoring methods, the excitation voltages are measured by, for example, directional couplers or pickup coils during the measurement. At a central location that is independent from the remaining software, time integrals are efficiently calculated from the measured variables using the cross correlations of the measured variables via quadratic forms using two-way multiplication of the excitation vectors with a sensitivity matrix. The time integrals are representative of maximum local or global SAR values that occur. In compliance with the SAR standards, the calculated values are compared with maximal permitted threshold values. The measurement is stopped or changed if the maximal permitted threshold values are exceeded, in accordance with the relevant monitoring rules that have been selected and are reliably correct owing to the mode check.

The detailed methods and designs as described above are exemplary embodiments, and the fundamental principle may also be varied in other fields by a person skilled in the art, without thereby departing from the scope of the invention as specified by the claims. Although the invention is described with reference to a magnetic resonance tomography system in the medical field, the present embodiments may also be applied to magnetic resonance tomography systems that are used in scientific and/or industrial fields. For the sake of completeness, use of the indefinite article "a" or "an" does not exclude the possibility that the relevant feature may also be present more than once. Likewise, the term "unit" does not exclude the possibility that this may consist of a plurality of components that may also be spatially distributed.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for checking a high-frequency transmit device of a magnetic resonance tomography system comprising a transmit antenna system that has a plurality of transmit channels for a magnetic resonance measurement of an examination object, the method comprising:
    determining excitation vectors that represent high-frequency signal strengths on the individual transmit channels for a plurality of time points or time periods;
    determining high-frequency exposure values absorbed in the examination object in accordance with predetermined check rules on the basis of the determined excitation vectors, wherein the high-frequency transmit device is restricted in function when an exposure check value that is based on at least one of the high-frequency exposure values reaches or exceeds a predetermined limit check value, wherein the check rules are predetermined as a function of a current transmit mode of the high-frequency transmit device; and
    verifying the respective transmit mode of the high-frequency transmit device on the basis of the determined excitation vectors,
    wherein when a transmit mode change is detected, the predetermined check rules are changed, the high-frequency transmit device is restricted in function, or a combination thereof,
    wherein during the verifying of the transmit mode, provision is made for verifying whether the high-frequency transmit device is operating in a volume coil mode,
    wherein for the purpose of determining a deviation of the operation of the high-frequency transmit device from the volume coil mode, quadratic forms of the respective current excitation vectors are generated using two-way multiplication with a projection matrix, and
    wherein the projection matrix is generated on the basis of excitation vectors occurring during operation in the volume coil mode.

2. The method as claimed in claim 1, wherein rules for determining the high-frequency exposure values, rules for determining the exposure check values, the limit check value, or a combination thereof are predetermined as a function of the transmit mode of the high-frequency transmit device.

3. The method as claimed in claim 1, wherein a mode check value that characterizes the transmit mode is determined on the basis of the excitation vectors, and the transmit mode change is detected when the mode check value deviates from a mode reference value by a specified degree.

4. The method as claimed in claim 1, wherein the volume coil mode comprises a CP mode.

5. The method as claimed in claim 1, wherein a mode check value is generated on the basis of a plurality of mode check partial values determined during a mode check time slot.

6. The method as claimed in claim 5, wherein a current cross-correlation matrix is calculated for a plurality of time points within a mode check time slot using dyadic multiplication of the respective current excitation vector with a complex-conjugate vector,
    wherein the cross-correlation matrices are added up to form a sum cross-correlation matrix, and the sum cross-correlation matrix is multiplied in terms of elements with the projection matrix, and
    wherein resulting product values are used to generate the mode check value for the respective mode check time slot.

7. The method as claimed in claim 6, wherein an exposure check value is based on a sum cross-correlation matrix that was calculated for a mode check time slot.

8. The method as claimed in claim 1, wherein an exposure check value is based on a multiplicity of high-frequency exposure values determined in an exposure check time slot.

9. The method as claimed in claim 1, wherein mode check time slots, exposure check time slots, or a combination thereof are each predetermined by a time window that slides over the excitation vectors in time segment.

10. The method as claimed in claim 2, wherein a mode check value that characterizes the transmit mode is determined on the basis of the excitation vectors, and the transmit mode change is detected when the mode check value deviates from a mode reference value by a specified degree.

11. The method as claimed in claim 2, wherein during the verification of the transmit mode, provision is made for verifying whether the high-frequency transmit device is operating in a volume coil mode.

12. The method as claimed in claim 3, wherein during the verification of the transmit mode, provision is made for verifying whether the high-frequency transmit device is operating in a volume coil mode.

13. The method as claimed in claim 3, wherein a mode check value is generated on the basis of a plurality of mode check partial values determined during a mode check time slot.

14. A high-frequency check device for checking a high-frequency transmit device of a magnetic resonance tomography system comprising a transmit antenna system that has a plurality of transmit channels, the high-frequency check device comprising:
a measured value interface operable to capture excitation vectors that represent high-frequency signal strengths on the individual transmit channels; and
a check signal interface operable to output check signals, the check signal interface being configured to:
determine high-frequency exposure values absorbed in the examination object in accordance with predetermined check rules on the basis of each of the excitation vectors, the high-frequency transmit device being restricted in function when an exposure check value that is based on at least one high-frequency exposure value reaches or exceeds a predetermined limit check value, wherein the check rules are predetermined as a function of a current transmit mode of the high-frequency transmit device; and
verify the respective transmit mode of the high-frequency transmit device on the basis of the excitation vectors,
wherein when a transmit mode change is detected, the check rules are changed, at least one check signal is generated, or a combination thereof in order to restrict the high-frequency transmit device in function,
wherein during the verification of the transmit mode, provision is made for verification of whether the high-frequency transmit device is operating in a volume coil mode,
wherein for the purpose of determination of a deviation of the operation of the high-frequency transmit device from the volume coil mode, quadratic forms of the respective current excitation vectors are generated using two-way multiplication with a projection matrix, and
wherein the projection matrix is generated on the basis of excitation vectors occurring during operation in the volume coil mode.

15. A high-frequency transmit device for a magnetic resonance tomography system, the high-frequency transmit device comprising:
a transmit antenna system comprising a plurality of transmit channels; and
a high-frequency power amplifier arrangement operable to emit high-frequency pulses over the plurality of transmit channels; and
a high-frequency check device comprising:
a measured value interface operable to capture excitation vectors that represent high-frequency signal strengths on the individual transmit channels; and
a check signal interface operable to output check signals, the check signal interface being configured to:
determine high-frequency exposure values absorbed in the examination object in accordance with predetermined check rules on the basis of each of the excitation vectors, the high-frequency transmit device being restricted in function when an exposure check value that is based on at least one high-frequency exposure value reaches or exceeds a predetermined limit check value, wherein the check rules are predetermined as a function of a current transmit mode of the high-frequency transmit device; and
verify the respective transmit mode of the high-frequency transmit device on the basis of the excitation vectors,
wherein when a transmit mode change is detected, the check rules are changed, at least one check signal is generated, or a combination thereof in order to restrict the high-frequency transmit device in function,
wherein during the verification of the transmit mode, provision is made for verification of whether the high-frequency transmit device is operating in a volume coil mode,
wherein for the purpose of determination of a deviation of the operation of the high-frequency transmit device from the volume coil mode, quadratic forms of the respective current excitation vectors are generated using two-way multiplication with a projection matrix, and
wherein the projection matrix is generated on the basis of excitation vectors occurring during operation in the volume coil mode.

16. A magnetic resonance tomography system comprising:
a high-frequency transmit device comprising:
a transmit antenna system comprising a plurality of transmit channels;
a high-frequency power amplifier arrangement operable to emit high-frequency pulses over the plurality of transmit channels; and
a high-frequency check device comprising:
a measured value interface operable to capture excitation vectors that represent high-frequency signal strengths on the individual transmit channels; and
a check signal interface operable to output check signals, the check signal interface being configured to:
determine high-frequency exposure values absorbed in the examination object in accordance with predetermined check rules on the basis of each of the excitation vectors, the high-frequency transmit device being restricted in function when an exposure check value that is based on at least one high-frequency exposure value reaches or exceeds a predetermined limit check value, wherein the check rules are predetermined as a function of a current transmit mode of the high-frequency transmit device; and
verify the respective transmit mode of the high-frequency transmit device on the basis of the excitation vectors,
wherein when a transmit mode change is detected, the check rules are changed, at least one check signal is generated, or a combination thereof in order to restrict the high-frequency transmit device in function,
wherein during the verification of the transmit mode, provision is made for verification of whether the high-frequency transmit device is operating in a volume coil mode,
wherein for the purpose of determination of a deviation of the operation of the high-frequency transmit device from the volume coil mode, quadratic forms of the respective current excitation vectors are generated using two-way multiplication with a projection matrix, and wherein the projection matrix is generated on the basis of excitation vectors occurring during operation in the volume coil mode.

17. In a non-transitory computer-readable storage medium that stores instructions executable by a high-frequency check device of a magnetic resonance tomography system comprising a transmit antenna system that has a plurality of transmit channels for a magnetic resonance measurement of an examination object, to check the high-frequency transmit device, the instructions comprising:

determining excitation vectors that represent high-frequency signal strengths on the individual transmit channels for a plurality of time points or time periods;

determining high-frequency exposure values absorbed in the examination object in accordance with predetermined check rules on the basis of the determined excitation vectors, wherein the high-frequency transmit device is restricted in function when an exposure check value that is based on at least one of the high-frequency exposure values reaches or exceeds a predetermined limit check value, wherein the check rules are predetermined as a function of a current transmit mode of the high-frequency transmit device; and verifying the respective transmit mode of the high-frequency transmit device on the basis of the determined excitation vectors, wherein when a transmit mode change is detected, the predetermined check rules are changed, the high-frequency transmit device is restricted in function, or a combination thereof, wherein during the verifying of the transmit mode, provision is made for verifying whether the high-frequency transmit device is operating in a volume coil mode, wherein for the purpose of determining a deviation of the operation of the high-frequency transmit device from the volume coil mode, quadratic forms of the respective current excitation vectors are generated using two-way multiplication with a projection matrix, and wherein the projection matrix is generated on the basis of excitation vectors occurring during operation in the volume coil mode.

\* \* \* \* \*